United States Patent
Chun et al.

(10) Patent No.: US 6,911,740 B2
(45) Date of Patent: Jun. 28, 2005

(54) SEMICONDUCTOR DEVICE HAVING INCREASED GAPS BETWEEN GATES

(75) Inventors: Yoon-soo Chun, Seoul (KR); Dong-won Shin, Kyungki-do (KR); Ki-nam Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/847,652

(22) Filed: May 17, 2004

(65) Prior Publication Data

US 2004/0207099 A1 Oct. 21, 2004

Related U.S. Application Data

(62) Division of application No. 10/266,220, filed on Oct. 8, 2002.

(30) Foreign Application Priority Data

Oct. 19, 2001 (KR) ........................................ 2001-64775

(51) Int. Cl.⁷ ............................................. H01L 27/088
(52) U.S. Cl. ....................... 257/900; 438/184; 438/230; 438/265; 438/303; 438/595
(58) Field of Search .......................... 257/900; 438/184, 438/230, 265, 303, 595

(56) References Cited

U.S. PATENT DOCUMENTS

| 5,183,770 | A | | 2/1993 | Ayukawa et al. ............... 437/41 |
|---|---|---|---|---|
| 6,121,631 | A | * | 9/2000 | Gardner et al. ................ 257/48 |
| 6,136,649 | A | | 10/2000 | Hui et al. ..................... 438/257 |
| 6,156,636 | A | | 12/2000 | Yeom et al. .................. 438/618 |
| 6,218,272 | B1 | * | 4/2001 | Yeom et al. .................. 438/586 |
| 6,221,714 | B1 | * | 4/2001 | Jang ............................ 438/241 |
| 6,271,087 | B1 | | 8/2001 | Kinoshita et al. ............. 438/258 |
| 6,335,279 | B2 | * | 1/2002 | Jung et al. .................... 438/666 |
| 6,346,468 | B1 | | 2/2002 | Pradeep et al. .............. 438/595 |
| 6,436,812 | B1 | | 8/2002 | Lee ............................... 438/636 |
| 6,451,708 | B1 | | 9/2002 | Ha ................................ 438/738 |
| 6,495,889 | B1 | | 12/2002 | Takahashi .................... 257/382 |

FOREIGN PATENT DOCUMENTS

| JP | 11097529 | 4/1999 |
|---|---|---|
| KR | 1999-005478 | 1/1999 |

* cited by examiner

*Primary Examiner*—Andy Huynh
(74) *Attorney, Agent, or Firm*—Myers Bigel Sibley & Sajovec, P.A.

(57) ABSTRACT

According to embodiments of the present invention, methods of manufacturing a semiconductor device, and semiconductor devices manufactured thereby, are provided. A field region is formed that defines active regions in a semiconductor substrate. Spaced apart gates are formed on the active regions in the semiconductor substrate. The gates have sidewalls that extend away from the semiconductor substrate. First spacers are formed on the sidewalls of the gates. Second spacers are formed on the first spacers and opposite to the gates. Ion impurities are implanted into the active regions in the semiconductor substrate, adjacent to the gates, using the first and second spacers as an ion implantation mask. A portion of the second spacers is removed to widen the gaps between the gates. A dielectric layer is formed on the semiconductor substrate in the gaps between the gates.

2 Claims, 13 Drawing Sheets

SEMICONDUCTOR DEVICE HAVING INCREASED GAPS BETWEEN GATES

RELATED APPLICATION

This application is a divisional of U.S. application Ser. No. 10/266,220, filed Oct. 8, 2002, which claims priority from Korean Application No.: 2001-0064775, filed on Oct. 19, 2001, the contents of each of which are herein incorporated by reference in their entirety.

FIELD OF THE INVENTION

The present invention relates to methods of manufacturing semiconductor devices, and more particularly, to methods of manufacturing semiconductor devices having spaced apart gates, and semiconductor devices manufactured thereby.

BACKGROUND OF THE INVENTION

As memory devices, such as DRAMs, are designed to operate at higher speeds and to have larger storage capacities, their integration densities have generally increased while their design rules have decreased. Horizontal gaps between individual devices in the memories, such as between gates or word lines, have generally reduced in proportion to the decreasing design rules. Moreover, the gap between devices may be further reduced when spacers are formed between the devices. As the gaps between devices become increasingly narrow, defects, such as poor contact filling or misalignment, may occur.

For example, bit lines may be insulated from gates by filling the gaps between the gates with an insulating layer. With decreased design rules, the gaps between the gates may become sufficiently narrow, such that the insulating layer does not completely fill the gaps and voids result. Filling defects may become particularly common when the design rules are reduced to about 0.14 μm or less. While the width of the gates and/or the thickness of spacers may be reduced to increase the gaps between the gates, the operational characteristics of the memory device, such as the refresh characteristics, may deteriorate.

SUMMARY OF THE INVENTION

According to embodiments of the present invention, a method of manufacturing a semiconductor device is provided. A field region is formed that defines active regions in a semiconductor substrate. Spaced apart gates are formed on the active regions in the semiconductor substrate. The gates have sidewalls that extend away from the semiconductor substrate. First spacers are formed on the sidewalls of the gates. Second spacers are formed on the first spacers and opposite to the gates. Ion impurities are implanted into the active regions in the semiconductor substrate, adjacent to the gates, using the first and second spacers as an ion implantation mask. A portion of the second spacers is removed to widen the gaps between the gates. A dielectric layer is formed on the semiconductor substrate in the gaps between the gates.

Using the spacers as a mask may reduce gate induced drain leakage or other deterioration of the characteristics of a semiconductor device, such as a transistor, that is fabricated in this manner. Reducing the thickness of the spacers can increase the gaps between the gates, and may reduce any occurrence of voids when the gaps are filled with a dielectric layer.

In some embodiments, impurity ions may be implanted to form source and drain regions in the active regions adjacent to the gates. The combined thickness of the first and second spacer may be sufficient to mask the substrate so that the gates do not overlap the source and drain regions. The second spacer may be thicker than the first spacer, and they may have different etching selectivity. In one embodiment, the first spacer may comprise silicon oxide and the second spacer may comprise silicon nitride. Accordingly, a portion of the second spacer may be removed, such as by etching, to widen the gaps, while leaving at least a portion of the first spacer on the sidewalls of the gates and on the semiconductor substrate between the gates. The remaining first spacer may be used as an etch stopper in subsequent processes.

In some embodiments of the present invention, the interlayer dielectric layer may be patterned to form contact holes that expose portions of the active regions in the semiconductor substrate and the sidewalls of the gates. Spacers may be formed that cover the sidewalls of the contact holes, including the exposed sidewalls of the gates. Ion impurities may be implanted into the active regions of the semiconductor substrate that are exposed by the contact holes. The second ion implantation process may reduce contact resistance between the conductive contact pads and the active regions in the semiconductor substrate. The spacers may be used as an ion implantation mask. The second spacers may avoid deterioration of the semiconductor device by the second ion implantation. Conductive pads may be formed in the contact holes.

In other embodiments of the present invention, a semiconductor device may be provided that includes a semiconductor substrate having active regions defined by a field region. Gates are spaced across the active regions. Source and drain regions are in the active regions adjacent to the gates. An interlayer dielectric layer is in the gaps between the gates. Spacers are between the sidewalls of the gates and the interlayer dielectric layer. The spacers have a sufficient thickness to mask the substrate so that the gates do not overlap the source and drain regions.

BRIEF DESCRIPTION OF THE DRAWINGS

Other features of the present invention will be more readily understood from the following detailed description of the invention when read in conjunction with the accompanying drawings, in which.

DETAILED DESCRIPTION OF THE INVENTION

Figure 1:
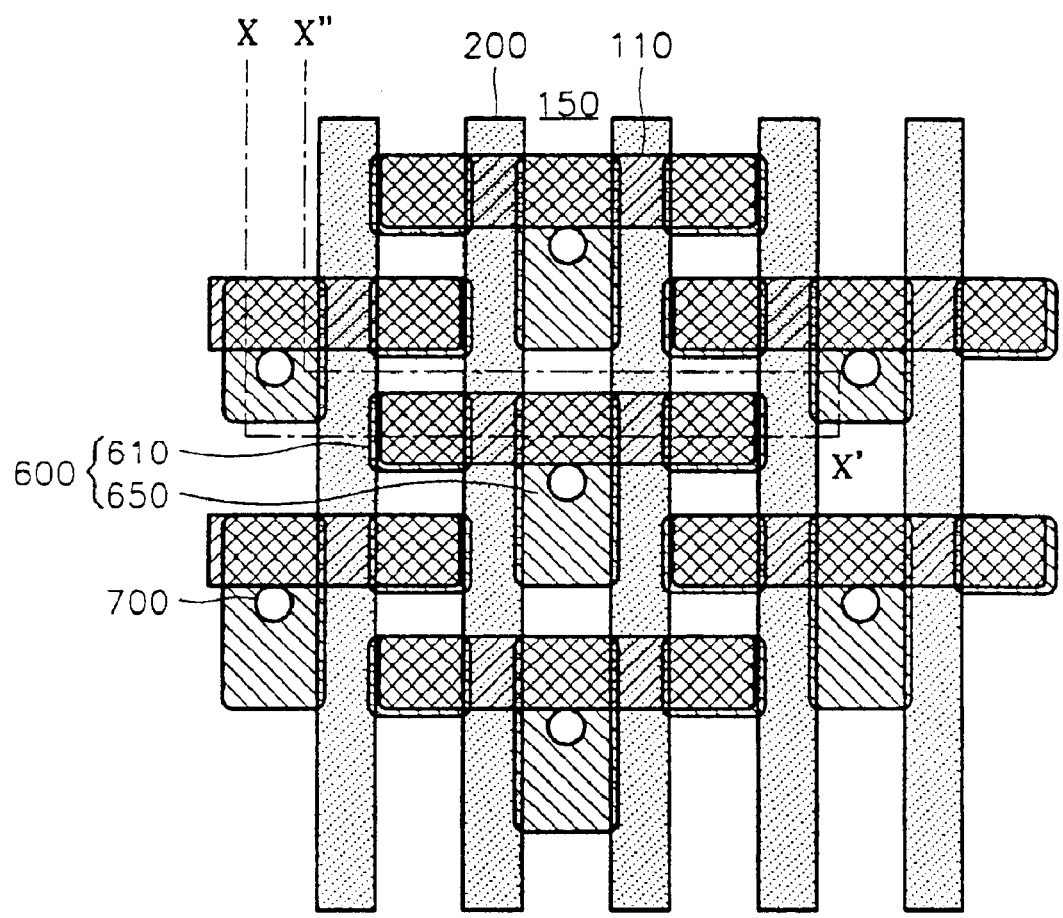
FIG. 1 is a plan view of a semiconductor device according to embodiments of the present invention.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. Like reference numerals in the drawings denote the same members. It will also be understood that when a layer is referred to as being "on" another layer or substrate, it can be directly on the other layer or substrate, or intervening layers may also be present.

Figure 2:
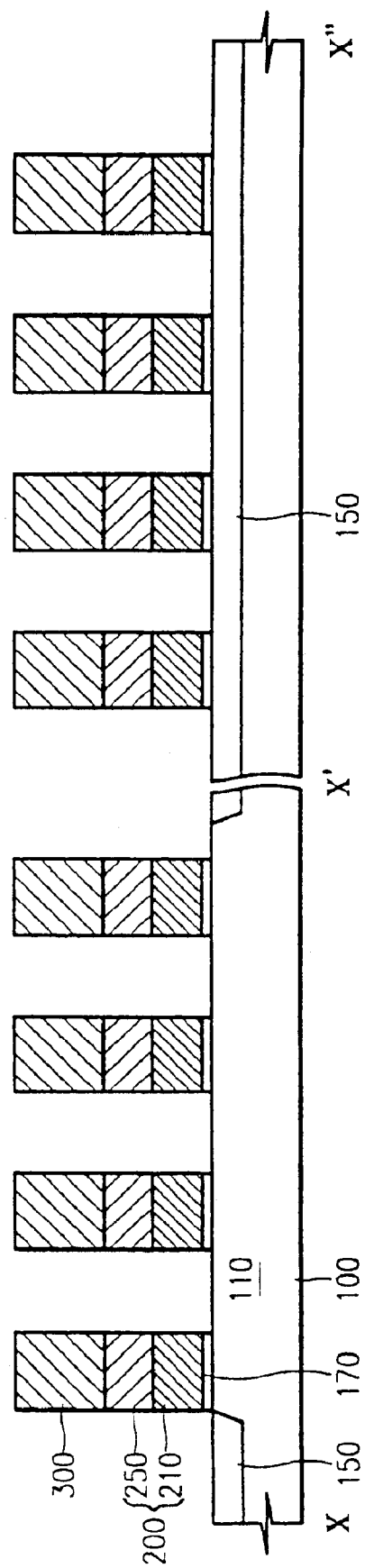
FIGS. 2 through 13 are cross-sectional views illustrating operations for manufacturing the semiconductor device of FIG. 1, taken along lines X–X' and X'–X", according to embodiments of the present invention.

FIG. 1 is a plan view of a semiconductor device, such as a DRAM, according to embodiments of the present invention. FIGS. 2 through 13 are cross-sectional views illustrating operations for manufacturing the semiconductor device of FIG. 1, taken along lines X–X' and X'–X", according to embodiments of the present invention. With reference first to FIGS. 1 and 2, the semiconductor device includes a substrate 100, active regions 110, field regions 150, and gates 200 that form a cell array. The field regions 150 and active regions 110 are formed in the substrate 100 using an isolation process. The field regions 150 may be defined by an insulating layer formed by a shallow trench isolation (STI) process in the substrate 100. The insulating layer may fill a trench formed in the semiconductor substrate 100, by the STI process, and may include silicon oxide.

The active regions 110 are defined adjacent to the field regions 150 on the surface of the substrate 100. As shown in FIG. 1, the active regions 110, along the plan view, are defined in bar shapes, although they may be defined in other shapes. A plurality of active regions 110 may be arranged along a plane of the semiconductor substrate 100, as shown in FIG. 1.

Spaced apart gate oxide layers 170 are formed on the semiconductor substrate 100. An ion implantation process may be performed in the semiconductor substrate 100, to adjust a well structure and a threshold voltage $V_T$ of a subsequently formed transistor, before the gate oxide layers 170 are formed.

Conductive layers for the gates 200 are sequentially formed on the gate oxide layers 170. In one embodiment, polysilicon layers 210 may be deposited, and then dichlorosilane tungsten silicide (DCS-$WSi_x$) layers 250 may be deposited. The polysilicon layers 210 may be deposited to a thickness of about 800 Å, and the tungsten silicide layers 250 may be deposited to a thickness of about 1000 Å. Capping insulating layers 300 may be formed on the tungsten silicide layers 250. The capping insulating layers 300 may be formed of silicon nitride to a thickness of about 1,500–1,800 Å.

Hard masks may be formed on the capping insulating layers 300. The hard masks may comprise silicon oxide, and may be used as an etching mask when the capping insulating layers 300, the tungsten silicide layers 250, and the polysilicon layers 210 are sequentially etched to pattern the gates 200. The sequentially etching may include photolithography to form the patterned gates 200 of stacked tungsten silicide layers 250 and the polysilicon layers 210. As shown in FIG. 1, the bar shaped gates 200 extend across the active regions 110 and are spaced apart from each other.

Figure 3:
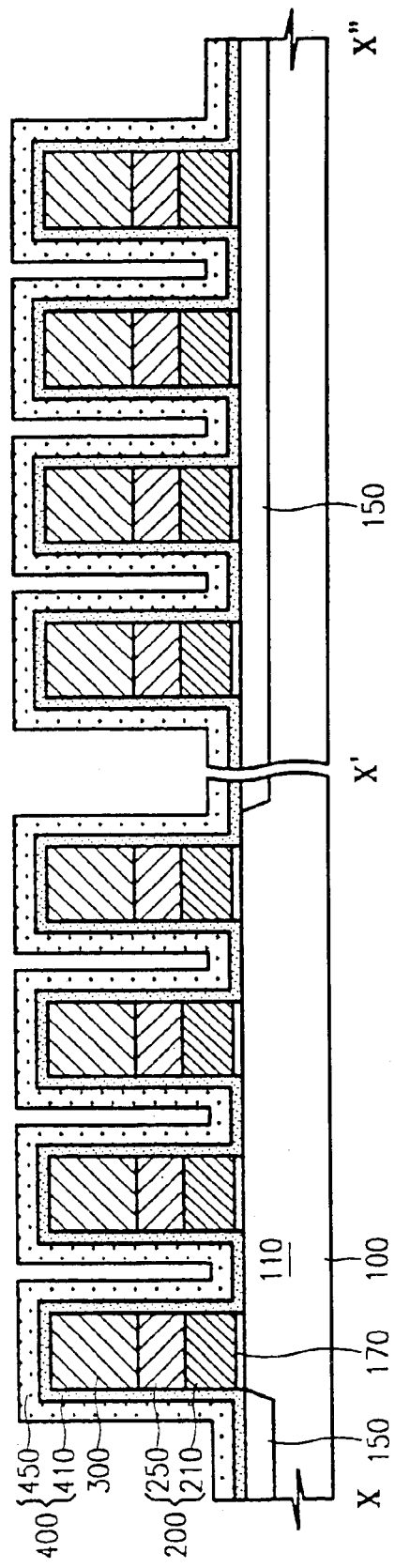

Referring to FIG. 3, a spacer layer 400 may be formed on the gates 200. The spacer layer 400 may include a first spacer layer 410 and a second spacer layer 450. Preferably, the spacer layer 400 includes two or more layers of different materials, such as materials having different dielectric constants and/or different etching selectivity. In one embodiment, the first and second spacer layers 410 and 450 are sequentially formed to cover sidewalls of the gates 200 and the capping insulating layers 300, where the sidewalls of the gates 200 extend away from the semiconductor substrate 100. The first spacer layer 410 may comprise silicon oxide with a thickness of about 150 Å. The second spacer layer 450 may comprise silicon nitride with a thickness of about 400–500 Å. The first spacer layer 410 may be between the second spacer layer 450, and the gates 200 and capping layers 300.

Figure 4:
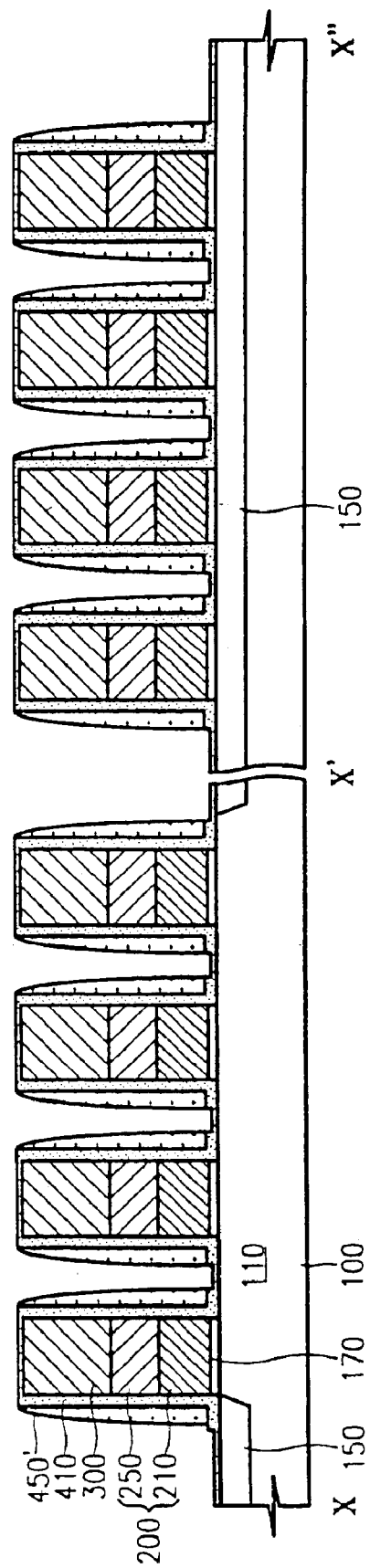

Referring to FIG. 4, at least a portion of the second spacer layer 450 may be removed, such as by an anisotropic etching process, from over portions of the semiconductor substrate 100, between the gates 200, to form second spacers 450' that cover the sidewalls of the gates 200 and sidewalls of the capping insulating layers 300. The first spacer layer 410 remains between the second spacers 450' and the gates 200 and between the second spacers 450' and the capping insulating layers 300. The thickness of the first spacer layer 410, that is exposed on the semiconductor substrate 100 between the gates 200 by the removal of the second spacer layer 450, may be reduced by about ½ of its thickness before the etching. When the first spacer layer 410 is formed with a thickness of about 150 Å, the portion of the first spacer layer 410 that is not covered with the second spacers 450' may be reduced to a thickness of about 80 Å by the etching. In this manner, the etching selectivity of silicon oxide of the first spacer layer 410 relative to the silicon nitride of the second spacer layer 450 may be used to selectively remove portions of the second spacer layer 450 to form the second spacers 450' while substantially leaving the first spacer layer 410 to cover the surface of the semiconductor substrate 100 between the gates 200. Moreover, the first spacer layer 410 may severs as an etch stopper in a subsequent process to selectively remove the second spacers 450'.

Figure 5:
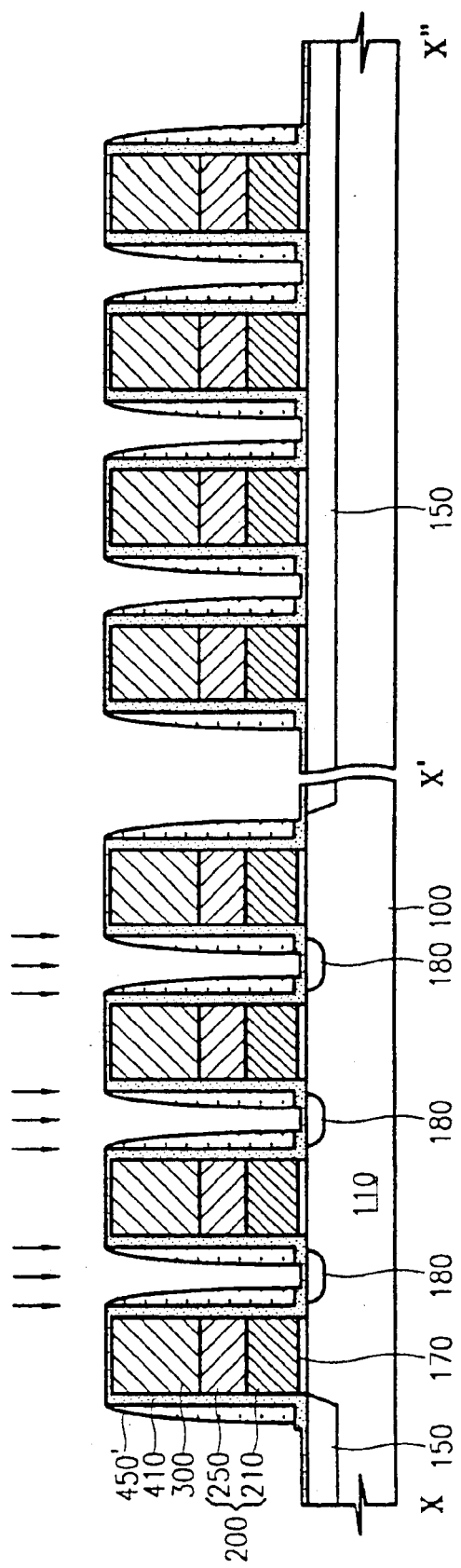

Referring to FIG. 5, source/drain regions 180 are formed in the semiconductor substrate 100 adjacent to the gates 200 for use as transistors. A cell ion implantation process is performed in cell regions. Impurity ions, such as $n^-$ ions, are implanted into the active regions 110 in the semiconductor substrate 100, between the second spacers 450', to form the source and drain regions 180. In one embodiment, phosphorous (P) is ion implanted into the active regions 110 at a concentration of about 5E12 (or $5 \times 10^{12}$) at an energy of about 20 eV to form the source and drain regions 180 in the active regions 110 between the gates 200. The ion implantation process may include a halo ion implantation process for forming halos around the source and drain regions 180.

The second spacers 450' may be used as an ion implantation mask during the ion implantation process for the source and drain regions 180. The second spacers 450' may serve to avoid reduction in the effective channel length that may be caused by the process of implanting $n^-$ ions into the source and drain regions 180. If the effective channel length were otherwise allowed to decrease, the sub-threshold current leakage may undesirably increase for the transistor formed by the gates 200 and source and drain regions 180. The combined thickness of the first and second spacers 410 and 450' should be sufficient to avoid the gates 200 overlapping with the source and drain regions 180. Otherwise, gate induced drain leakage (GIDL) current may increase and the refresh characteristics of the device may deteriorate. As previously described, in one embodiment, the second spacers 450' may have a thickness of about 400–500 Å along at least a portion of the sidewalls of the gates.

Figure 6:
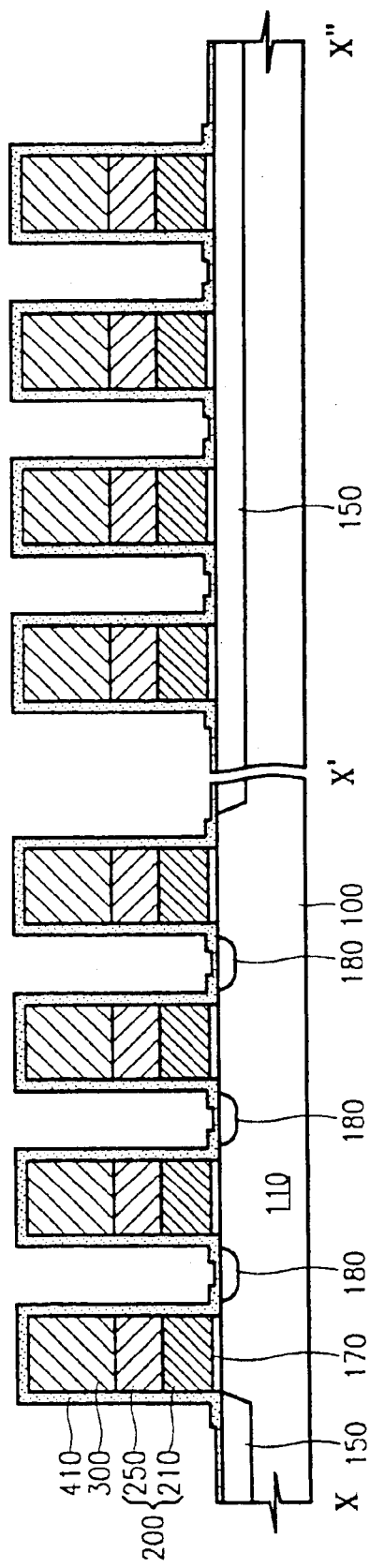

Referring to FIG. 6, the second spacers 450' may be removed, such as by selective etching. In one embodiment, the silicon nitride of the second spacers 450' is removed by etching, using wet etching with phosphoric acid, while substantially leaving the silicon oxide of the first spacer layer 410. The first spacer layer 410 may serve as an etch stopper to protect the semiconductor substrate 100 between the gates 200, and the capping insulating layers 300, during the etching process to remove the second spacers 450'.

Figure 7:
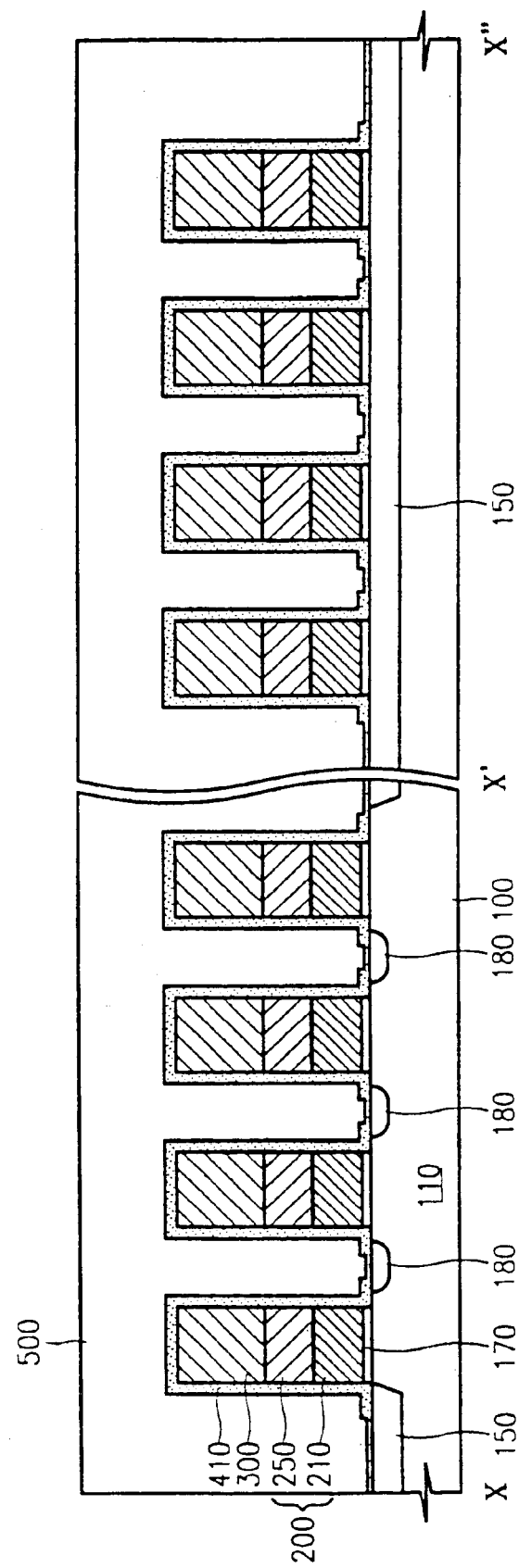

Referring to FIG. 7, an interlayer dielectric (ILD) layer 500 may be formed to fill the gaps between the gates. The ILD layer 500 insulates the gates 200 from bit lines (not shown) that may be formed later. The ILD layer 500 may be formed from one or more of many dielectric materials, such as silicon oxide, and may comprise a stack of a plurality of different dielectric material layers. The second spacers 450' between the gates 200 are removed before the ILD layer 500 is deposited to widen the gaps between the gates 200. With the second spacers 450' removed, the ILD layer 500 may more easily fill the gaps between the gates 200, and voids may be prevented from occurring.

When the second spacers 450' have a thickness of about 400–500 Å, the gaps between the gates 200 may be widened to a width of about 800–1,000 Å when the second spacers 450' are removed. If the ILD layer 500 were formed before the second spacers 450' were removed, it may be more difficult to fill the gaps between the gates 200, which may be only about 600 Å, without voids. However, when the second spacers 450' are removed, the gaps between the gates 200 may be widened to at least 1,200 Å. The ILD layer 500 may then be deposited without filling defects, such as voids, due to the larger gap between the gates 200.

As before, the first spacer layer 410 covers the surface of the semiconductor substrate 100 in which the source and drain regions 180 are formed, and may protect the source and drain regions 180 from being damaged.

The surface of the ILD layer 500 may be planarized, such as by chemical mechanical polishing (CMP) or etch back. The ILD layer 500 may be planarized to a thickness of about 1,000 Å on the capping insulating layers 300 on the gates 200.

Figure 8:
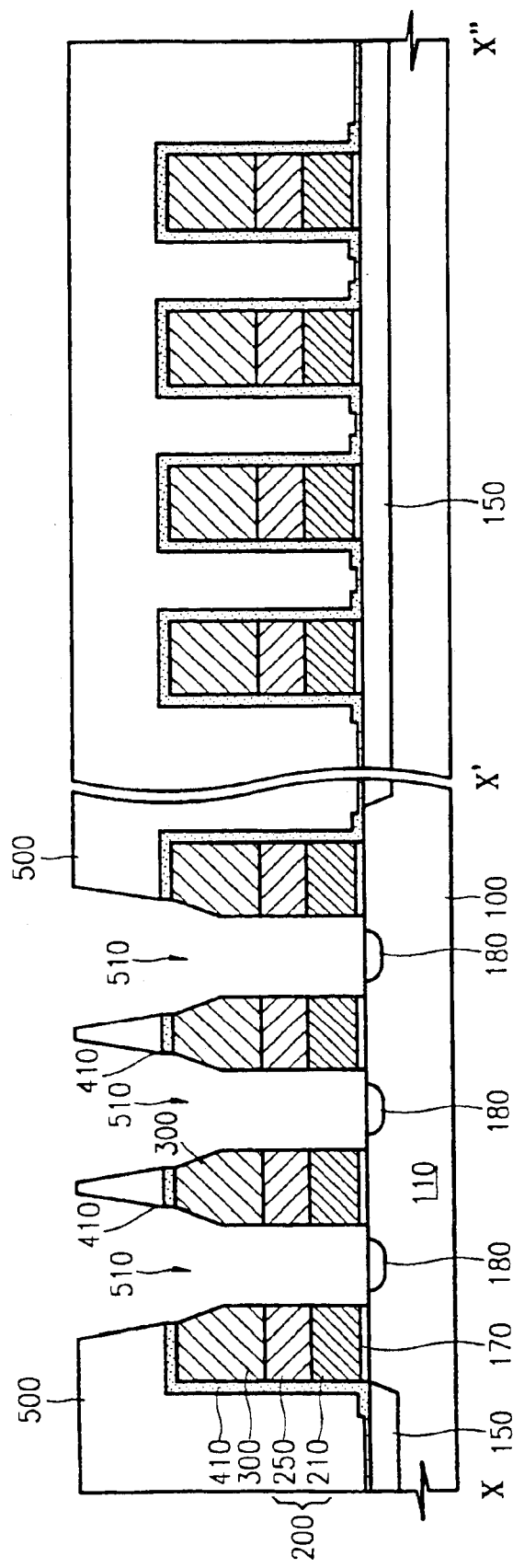

In FIG. 8, the ILD layer 500 is patterned to form contact holes 510 between the gates 200. The ILD layer 500 may be patterned by photolithography and self-aligned contact (SAC) to form the contact holes 510. Conductive contact pads 600 may be formed in the contact holes 510, such as is shown of FIG. 1, for connecting the transistors to subsequent interconnection lines or capacitors.

It may be preferable to form the contact holes 510 using a SAC etching process. In one embodiment using photolithography, an etching mask, such as a resist pattern, is formed that exposes positions on the ILD layer 500 where the contact holes 510 are to be formed. The exposed ILD layer 500 is then etched to selectively remove the exposed portions, and then exposed first spacer layer 410 is removed.

The etching process for forming the contact holes 510 may be performed in a manner that leaves at least a portion of the capping insulating layers 300. In one embodiment, the etching process has a sufficient etch selectivity with respect to the capping insulating layers 300, so that the ILD layer 500 is etched at a higher rate. For example, the above-described SAC etching may be performed by dry etching using $C_5F_8$ and $O_2$ as an etch reaction gas. The etch reaction gas may further include argon (Ar). Dry etching using this etch reaction gas can obtain an etch selectivity of about 15:1 of silicon oxide to silicon nitride.

Portions of the first spacer layer 410 covering the sidewalls of the gates 200 may be selectively removed by the etching process for forming the contact holes 510. Portions of the first spacer layer 410 covering the surface of the semiconductor substrate 100 may also be removed, and thus the surface of the semiconductor substrate 100 may be exposed. As a result, the contact holes 510 may extend along the exposed sides of the gates 200 and the exposed sides of the capping insulating layers 300. Portions of the first spacer layer 410, which are not in the contact holes 510 and covered with the ILD layer 500, may remain on the sidewalls of the gates 200, as shown in FIG. 8. Also, when the contact holes 510 are formed by SAC, edge portions of the capping insulating layers 300 may be etched, as shown. The etched edge portions of the capping insulating layers 300 may be compensated in a subsequent process.

Figure 9:
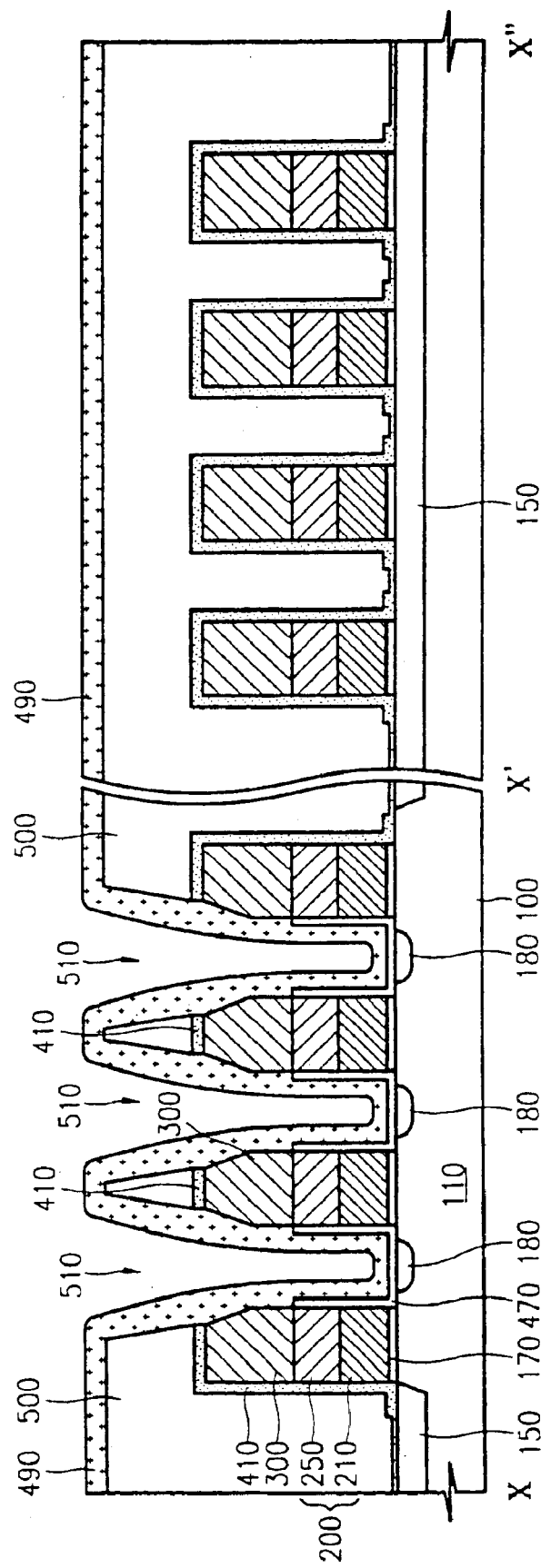

In FIG. 9, third and fourth spacer layers 470 and 490 may be formed, for example, to protect the sidewalls of the gates 200 exposed by the contact holes 510. The third spacer layers 470 may be formed to selectively cover the exposed sidewalls of the gates 200. In one embodiment, the third spacer layers 470 may be selectively grown to cover the exposed sidewalls of the gates 200 by thermally oxidizing the silicon oxide. Because the gates 200 are formed of polysilicon layers 210 and tungsten silicide layers 250, silicon oxide may be selectively grown from the exposed sidewalls of the gates 200 by an oxidation process. The third spacer layers 470 may also be grown from the surface of the semiconductor substrate 100 exposed by the contact holes 510, adjacent to the gates 200, and may be extended upwardly therefrom.

The fourth spacer layers 490 may be formed on the third spacer layers 470. The fourth spacer layers 490 may be used as a mask in a subsequent ion implantation process and may be formed of a dielectric material, such as silicon nitride. In one embodiment, silicon nitride may be deposited to a thickness of about 200–300 Å to form the fourth spacer layers 490.

Figure 10:
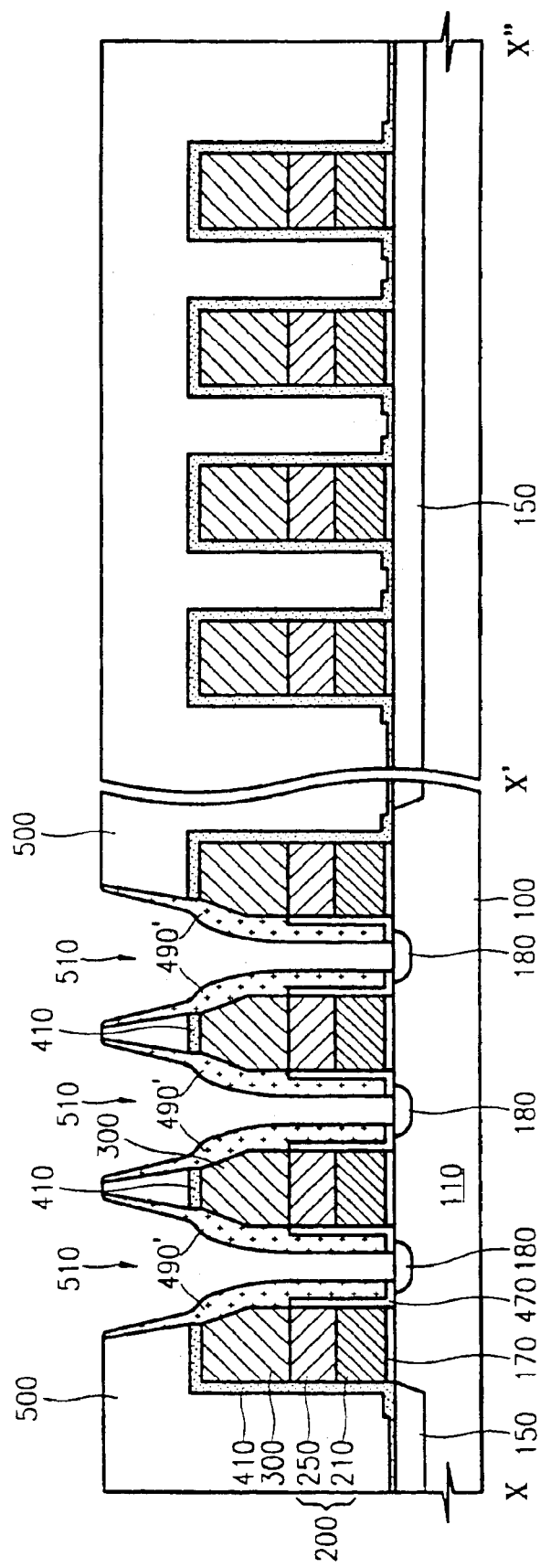

In FIG. 10, portions of the fourth spacer layers 490 may be removed, such as by etching, to form fourth spacers 490'. In one embodiment, the fourth spacer layers 490 are anisotropically etched to form the fourth spacers 490' that cover the sidewalls of the capping insulating layers 300 and the sidewalls of the gates 200. It may be preferable to perform the anisotropic etching so that portions of the fourth spacers 490 that cover the semiconductor substrate 100 are removed to expose the surface of the semiconductor substrate 100 in the contact holes 510.

Figure 11:
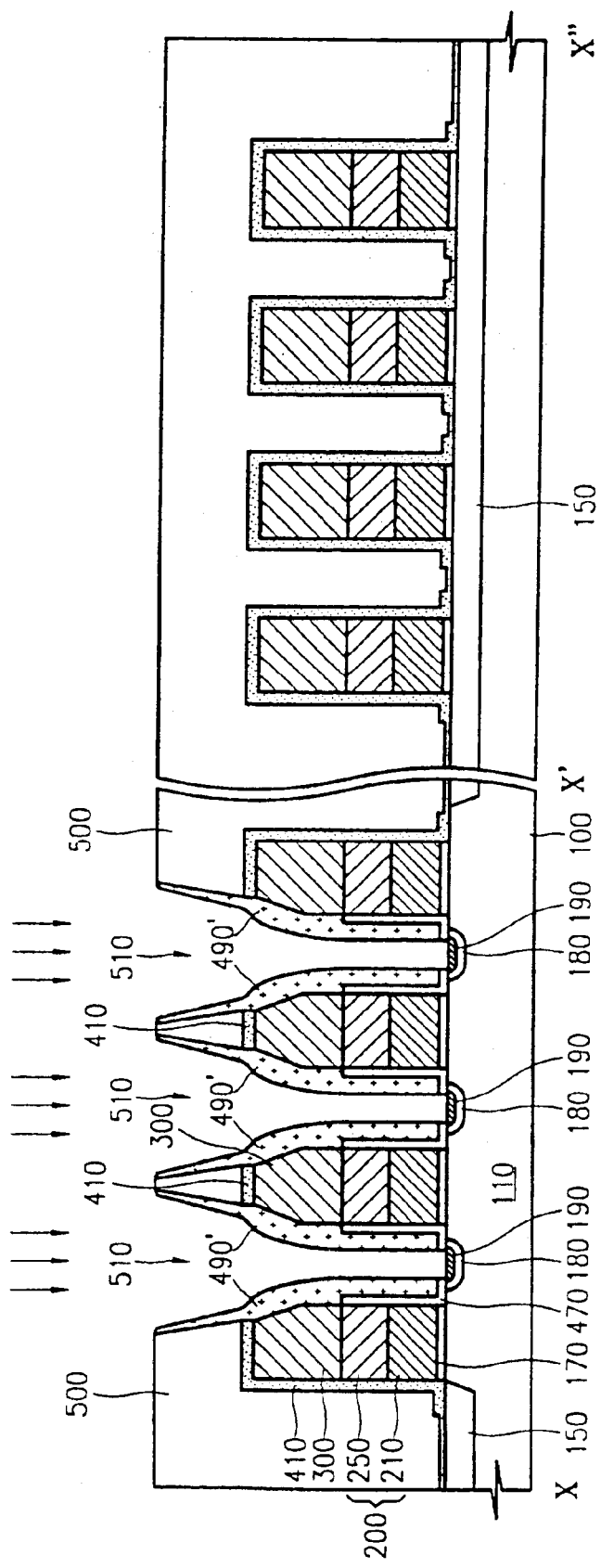

In FIG. 11, ions may be implanted in the semiconductor substrate 100 exposed by the contact holes 510 using the fourth spacers 490' as an ion implantation mask. The ion implanting process may form impurity regions 190 in the surface of the semiconductor substrate 100. The ion implantation process may reduce contact resistance between conductive contact pads, that may be subsequently formed to fill the contact holes 510 and the active regions 100, in the semiconductor substrate 100.

Figure 12:
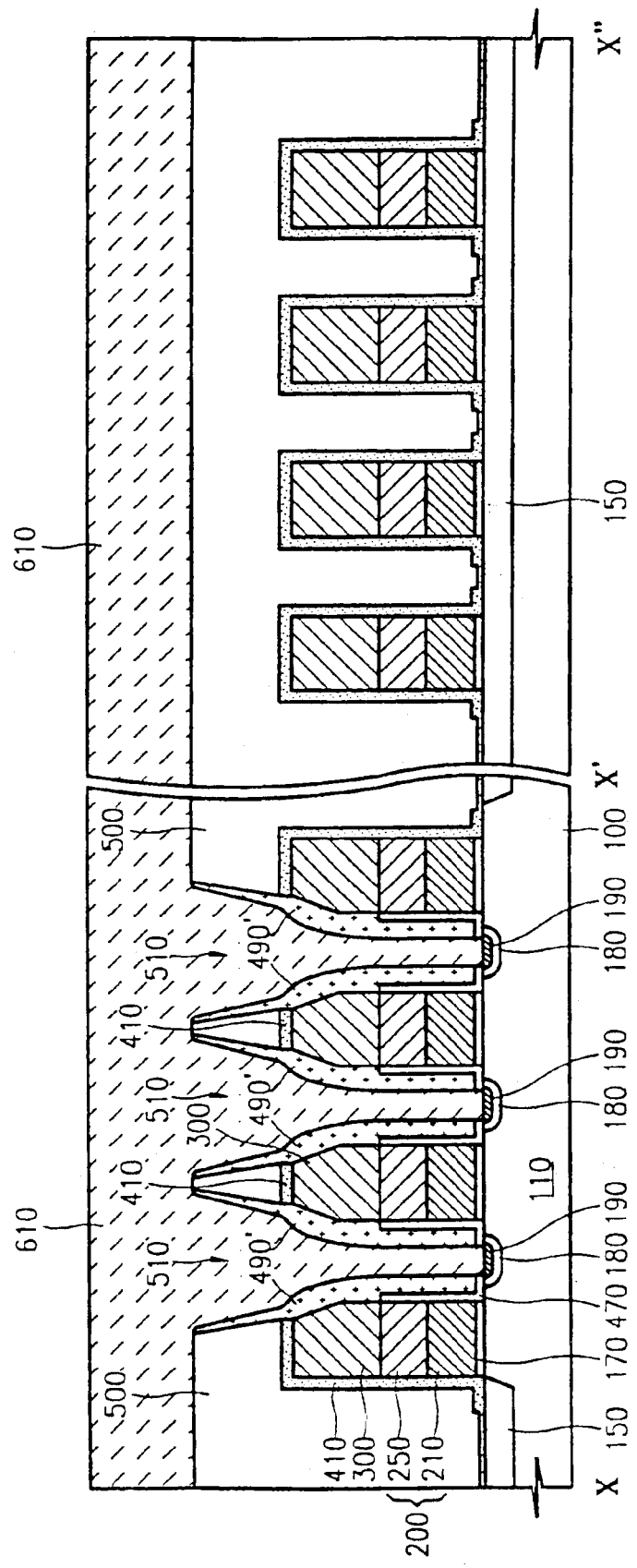

In FIG. 12, a conductive layer 610 may be formed to fill the contact holes 510 and contact the semiconductor substrate 100. The conductive layer 610 may be formed by depositing a polysilicon layer.

Figure 13:
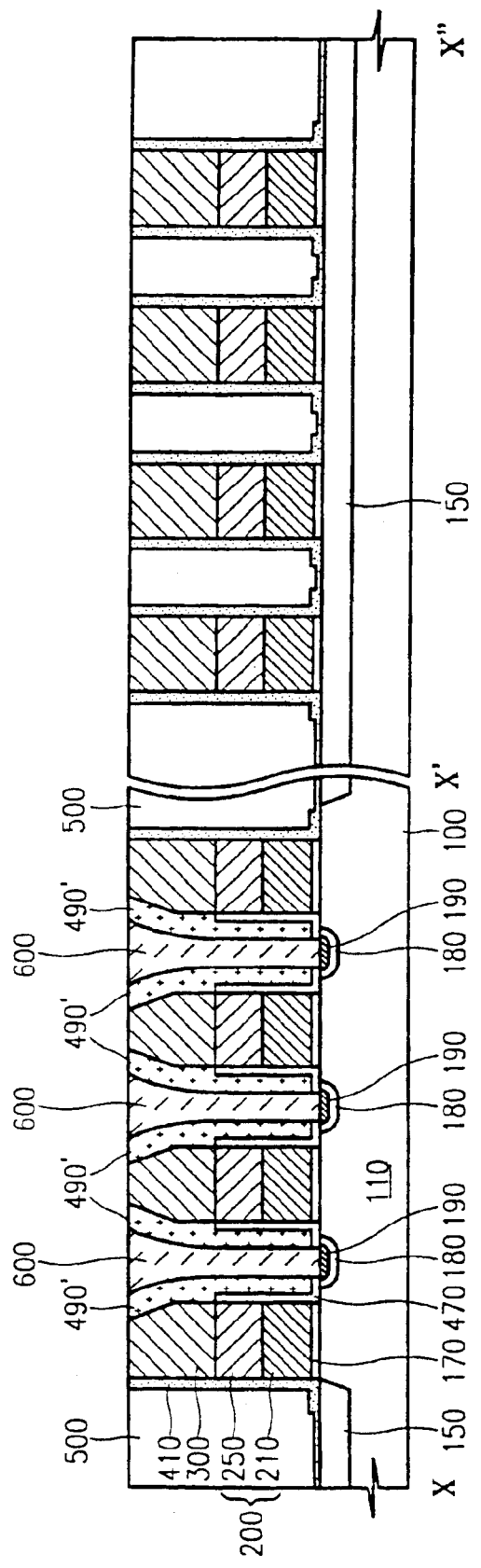

In FIG. 13, the conductive layer 610 may be planarized to form separate conductive contact pads 600 in the contact holes 510. The conductive layer 610 may be planarized by CMP or etch back. It may be preferable to planarize the conductive layer 610 until the capping insulating layers 300 are exposed. The separate contact pads 600 may later be connected to bit lines (not shown) or storage nodes (not shown) of capacitors. Referring to FIG. 1, the conductive contact pads 600 may be classified as conductive contact pads 610, connected to buried contacts (BC) (not shown), that may be connected to the storage nodes, and conductive contact pads 650, connected to direct contacts (DC) (not shown), which may be connected to bit lines. Reference numeral 700, shown in FIG. 1, represents the positions of contact holes 700 for the DC, according to an embodiment of the invention.

According to some aspects of these embodiments, spacers may be provided along the sidewall of the gates. The spacers may be used as an ion implant mask for the semiconductor substrate when ions are implanted into the substrate to form source and drain regions. The thickness of the spacers may be sufficient to mask the substrate so that the gates do not overlap the source and drain regions, and, may thereby, avoid GIDL and/or other deterioration of the device characteristics. The thickness of the spacers may then be reduced to facilitate filling of the gaps with an ILD layer, while substantially avoiding voids in the filled layer. Contact holes for conductive contact pads may be formed in the ILD layer. Spacers may then be formed on the sidewalls of the contact holes, and may be used as an ion implantation mask for the semiconductor substrate. Ions may be implanted in the contact holes to reduce contact resistance between conductive contact pads, which may be formed in the contact holes, and the active regions in the semiconductor substrate.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor device comprising:

a semiconductor substrate including active regions defined by a field region;

gates disposed on the active regions;

source and drain regions in the active regions adjacent to the gates;

an interlayer dielectric layer in gaps between the gates;

spacers between sidewalls of the gates and the interlayer dielectric layer, the spacers comprising at least two layers of different materials;

gate oxide layers between the gates and the active regions;

capping insulating layers on the gates; and conductive contact pads penetrating the interlayer dielectric layer and electrically connected to the active regions, wherein the spacers comprise:

first spacer layers between the interlayer dielectric layer and the sidewalls of the gates, and including a silicon oxide layer; and second spacer layers between the conductive contact pads and the sidewalls of the gates and including a silicon oxide layer and a silicon nitride layer.

2. A semiconductor device of claim 1, wherein the spacers have a sufficient thickness to mask the substrate when impurity ions are implanted to form the source and drain regions and so that the gates do not overlap the source and drain regions.

* * * * *